United States Patent [19]

Rotter et al.

[11] 4,184,178
[45] Jan. 15, 1980

[54] DROP-OUT COMPENSATOR FOR SOUND REPRODUCING APPARATUS DURING TAPE REVERSAL

[75] Inventors: Gerhard Rotter, Mission Viejo; Roland H. W. Roos, Orange, both of Calif.

[73] Assignee: BASF Aktiengesellschaft, Ludwigshafen, Fed. Rep. of Germany

[21] Appl. No.: 737,145

[22] Filed: Oct. 29, 1976

Related U.S. Application Data

[63] Continuation-in-part of Ser. No. 419,061, Nov. 26, 1973, abandoned.

[30] Foreign Application Priority Data

Nov. 30, 1972 [DE] Fed. Rep. of Germany ....... 2258608

[51] Int. Cl.$^2$ .................... G11B 5/02; G11B 15/18
[52] U.S. Cl. ........................ 360/27; 179/100.1 R; 179/100.1 VC; 179/100.4 D; 360/38; 360/74.1
[58] Field of Search ............... 360/38, 27, 30, 74, 360/78; 179/100.1 R, 100.1 S, 100.1 VC, 100.4 D, 1 P

[56] References Cited

U.S. PATENT DOCUMENTS

| | | | |
|---|---|---|---|
| 2,996,576 | 8/1961 | Dolby | 360/38 |
| 3,280,270 | 10/1966 | Allington | 360/30 |
| 3,356,794 | 12/1967 | Felix | 360/38 |
| 3,407,266 | 10/1968 | Araki et al. | 360/38 |
| 3,487,175 | 12/1969 | Newell | 179/100.1 S |
| 3,678,416 | 7/1972 | Burwen | 179/1 P |
| 3,936,619 | 2/1976 | Sugimoto | 179/100.4 D |
| 3,958,272 | 5/1976 | Rotter et al. | 360/74 |
| 4,021,852 | 5/1977 | Hurst et al. | 360/38 |

FOREIGN PATENT DOCUMENTS

741333 11/1955 United Kingdom ............. 179/100.4 D

*Primary Examiner*—Raymond F. Cardillo, Jr.
*Attorney, Agent, or Firm*—Keil & Witherspoon

[57] ABSTRACT

The invention comprises a circuit arrangement for a sound-reproducing apparatus, particularly a video tape recorder having an audio channel, wherein upon the occurrence of a sound signal drop-out interval within a continuous audio signal, for example within the track-switching period in multi-track sound recordings, an audio frequency signal is inserted in the drop-out interval so that the interval is rendered unnoticeable to the listener. The apparatus can be advantageously employed for recorders in which sound signals are recorded on the tracks of a magnetic tape or disc, or on grooved tracks in a disc. In one preferred embodiment of the invention the arrangement comprises circuitry for attenuating the noise burst which occurs during the track-switching period of a multi-track recorder using a frequency modulated audio signal, the degree to which the noise is attenuated being correlated to the level of the immediately preceding audio signal. Further embodiments of the invention comprise circuitry for inserting audio frequency noise signals of a predetermined level during the drop-out interval.

12 Claims, 10 Drawing Figures

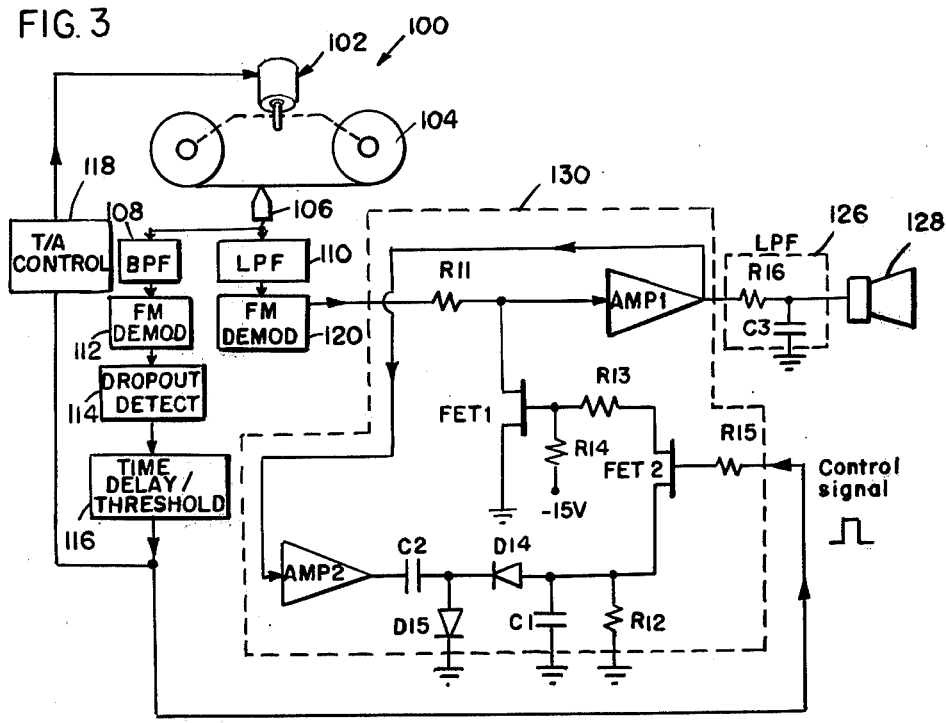
FIG. 3
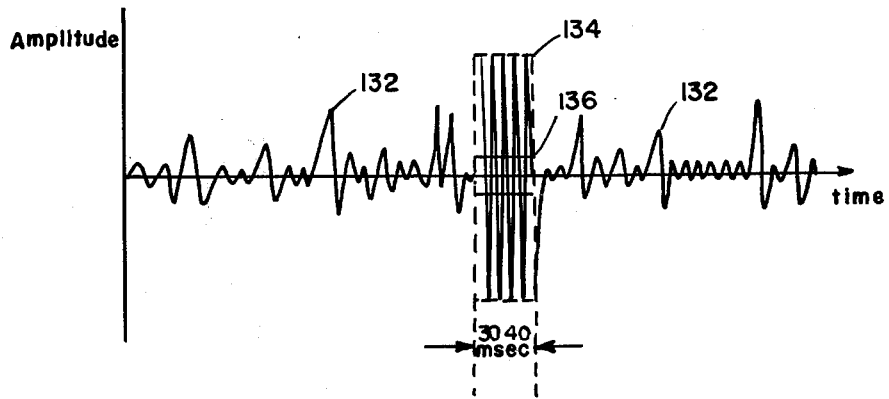
FIG. 4   FM Demodulator Output
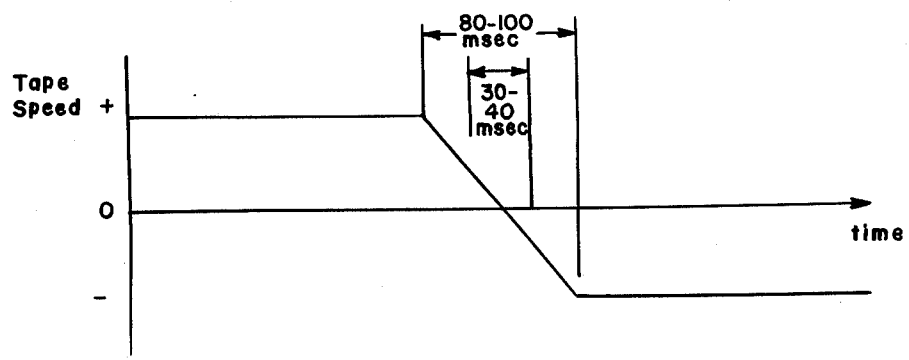
FIG. 5   Tape Turnaround

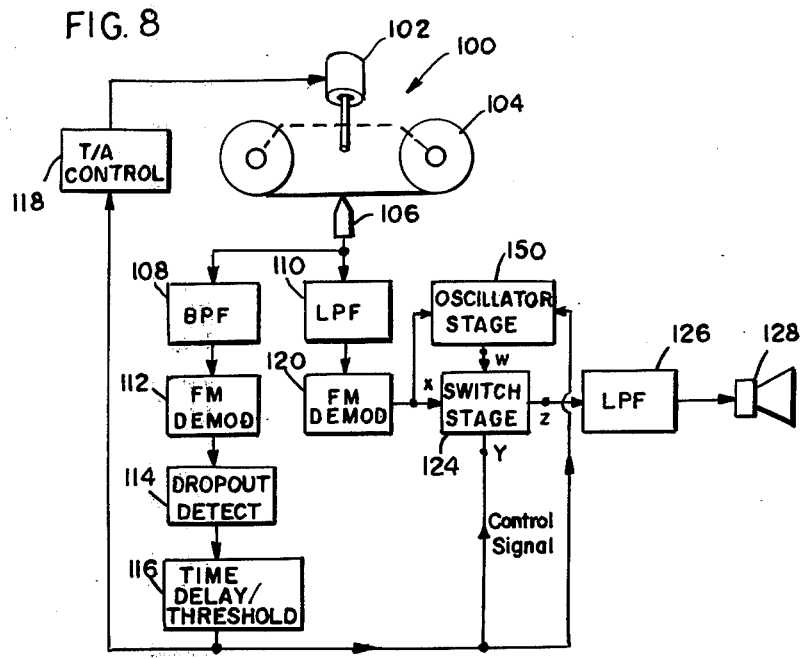
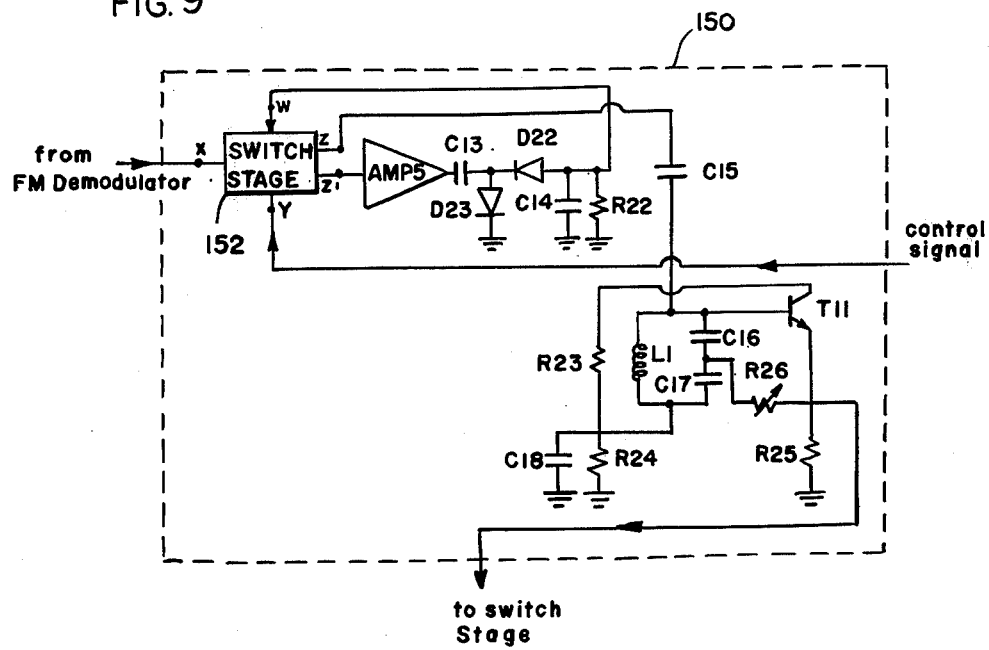

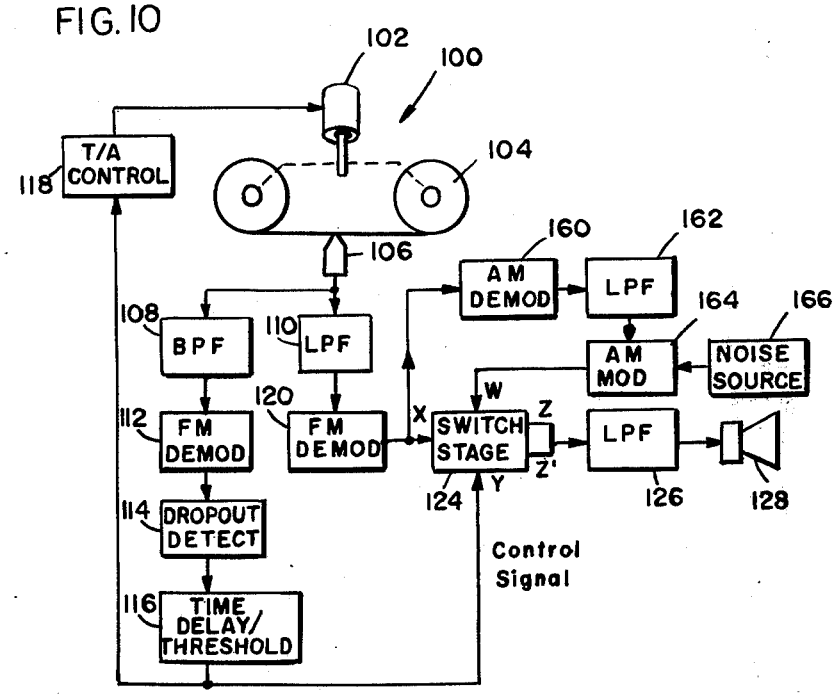

DROP-OUT COMPENSATOR FOR SOUND REPRODUCING APPARATUS DURING TAPE REVERSAL

This is a continuation-in-part of our copending Application Ser. No. 419,061, filed Nov. 26, 1973, now abandoned.

BACKGROUND OF THE INVENTION

1. Field of the Invention

The invention relates to drop-out compensation circuit arrangements for sound-reproducing apparatus in which a sound signal carried on a recording medium is played back, the medium being scanned by a pickup device and subsequently reproduced acoustically.

2. The Prior Art

U.S. Pat. No. 3,356,794 to Felix concerns reproducing circuits for wide-band magnetic recorders utilizing frequency modulation of a carrier with a video or other wide-band signal. As described in detail in the 3,356,794 patent, objectionable bursts of noise are produced by the frequency demodulator when the signal level from the magnetic medium falls off to a low, substantially non-existent level such, as, for example, during signal dropouts. In order to avoid such objectionable noise bursts the variable gain amplifier-limiter associated with the frequency demodulator circuit receives the signal from the transducer as well as a supplementary signal from an oscillator. The oscillator provides a constant signal which is at approximately one tenth the amplitude of the normal video signal from the transducer. The amplifier-limiter has a relatively low gain when the normal video signal is present, but changes to a relatively higher gain when only the oscillator signal is present. The oscillator signal prevents system noise from being demodulated and causes the output of the frequency demodulator to be maintained at an acceptable level such that drop-outs of the signal will not result in noise bursts which are noticeable as visible streaks and flashes to the viewer. It is to be noted that the Felix disclosure does not concern narrow-band signals, such as audio signals, nor does it attempt to remove completely the background noise from oscillator 20 during those periods when no drop-out is present.

U.S. Pat. No. 3,407,266 to Araki et al is concerned with the video drop-out which occurs in a helical-scan recorder when track-switching takes place. The Araki et al device produces two signal transducing heads which are spaced apart by an integral number of horizontal line lengths. When track-switching takes place, the output portion of the reproduction electronics is switched from one head to the other so that a few adjacent lines of the video signal are inserted into the track-switching drop-out interval. In this manner the synchronization pulses are maintained over the drop-out interval. A disc having an opening is rotated along with the heads so that a photocell will sense light passing through the opening and provide a switching signal at a predetermined time relative to track-switching. The signal from the photocell is used to momentarily switch the playback electronics coming from one head to the other. Those skilled in the art will recognize from the discussion below that the track-switching signal from the photocell of the Araki et al patent may be advantageously used in the circuitry of the present invention, as well. As will be described in greater detail below, the present invention is concerned with providing a suitable audio signal level during track-switching drop-outs of the type concerned in the Araki et al disclosure.

U.S. Pat. No. 3,699,246 to Hodge teaches means for detecting drop-outs in video signals and for switching in a delayed version of the signal during the drop-outs. Such technique is well known in the art and performs at least two useful functions. First, synchronization pulses are maintained during the drop-out interval and, secondly, streaking and flashes in the video signal are eliminated by substituting an acceptable signal level for objectionable noise levels. The delayed video lines which are substituted for objectionable noise during the drop-out intervals are not particularly noticeable to the viewer since there is considerable similarity between adjacent video lines.

In addition to the teachings of the foregoing patents which are concerned only with drop-outs in wide-band, or video, signals, several prior art patents are known which concern problems of noise bursts or drop-outs in narrow-band, or audio, signals. For example, German Patentschrift No. 865,068 relates to the problem of bridging brief sound gaps which occur in the audio signal reproducing channel of a movie film projector at splice points in the film. Such sound gaps are brief, but noticeable to the listener, if no steps are taken to mask or bridge the gap. German Patentschrift No. 865,068 points this out and provides for insertion in the sound gap of a noise signal which is approximately the same in level as the audio signals which precede and succeed the gap or splice points. This is accomplished by adding to the film sound track a segment at the desired noise level.

The present inventors have found that drop-outs in the signal from the recording medium transducer in a frequency modulated audio signal channel results in objectionable audio-frequency noise bursts at the output of the frequency demodulator. While such noise bursts may be blanked out entirely as taught, for example, in U.S. Pat. No. 2,288,000 to Kelly, the present inventors have found that total blanking out of such noise bursts results in sound gaps similar to those discussed in German Patentschrift No. 865,068, and such sound gaps are noticeable to the listener. Brief signal gaps or objectionable noise bursts occur with such regularity in recording in recording systems taught, for example. In U.S. Pat. Nos. 3,958,272 and 3,407,266, among others, that steps must be taken to render these occurrences innocuous to the listener if the recording systems are to be commercially acceptable.

SUMMARY OF THE INVENTION

It is accordingly an object of the present invention to provide means in an audio-reproducing signal channel for maintaining the output audio-frequency signal at an appropriate level during periodically recurring signal drop-outs from the recording medium, so that the listener will not perceive such drop-outs as disagreeable disturbances.

It is yet a further object of the present invention to provide, in a channel for audible reproduction of frequency-modulated audio signals, means for controlling noise bursts which would be objectionable to the listener and for assuring that an acceptable-level audio signal is substituted for such noise bursts.

It is yet a further object of the present invention to provide means for attenuating periodically recurring noise bursts in a frequency-modulated audio signal reproduction channel to an acceptable level.

Yet a further object of the present invention is to provide, during signal drop-outs from tape turnaround, track-switching, or the like, means for inserting during periodic signal drop-outs an audio-frequency signal of a level which is correlated to the preceding audio signal level. The term "correlated to" as used herein includes the case of "being the same as" or "being substantially the same as".

The preferred embodiments of the present invention are intended for use, for example, in an audio reproduction channel of a video tape recorder of the reversible-drive type described in U.S. Pat. No. 3,958,272, wherein the audio signal is used to frequency modulate a carrier. During the tape turnaround interval of such a recorder the output of the playback signal transducer drops substantially to zero for a brief period of time, such as 30–40 milliseconds (msecs). The output of the frequency demodulator of the audio channel is, during such signal drop-out intervals, an objectionably high-level audio frequency noise signal. This is an inherent result of the variable-gain amplifier/limiter which is conventionally used for demodulation of FM signals. One embodiment of the present invention comprises a squelch circuit which reduces such high-level noise bursts to a level which is correlated to the preceding audio signal level, the attenuated noise burst signal preferably being approximately 0 dB to 6 dB down from the preceding audio level.

Another embodiment of the present invention, the embodiment taken up first in the detailed description given hereinbelow, utilizes, in a fashion similar to the known video signal drop-out compensation systems, a delay line which provides at its output the audio signal delayed by a predetermined time. The signal which reaches the ears of the listener is then the non-delayed audio signal, except during turnaround when a segment of the delayed audio signal is substituted for the otherwise objectionable noist bursts. Further embodiments of the invention provide a supplemental signal source such as a noise generator or an oscillator, for substitution during the audio drop-out noise burst interval.

It will be seen that the arrangements of the present invention are useful not only with the video tape system described in U.S. Pat. No. 3,958,272, but also with helical scan tape systems, magnetic disc drives and other types of signal reproducing devices in which signal drop-outs periodically recur. Furthermore, the arrangements of the present invention are suitable for use with systems which utilize direct audio recording or amplitude modulated audio recording rather than frequency modulated audio recording. Those skilled in the art will recognize that drop-outs which occur during turnaround or track-switching or the like in amplitude modulation or direct recording system will not ordinarily result in objectionable noise bursts but will instead produce noticeable audio signal gaps. Such gaps may be compensated by insertion of a delayed audio signal or of an independently generated audio-frequency signal which has a level correlated to the preceding audio signal level from the recording medium.

The above described objects, as well as further objects of the present invention, will become apparent to those skilled in the art in view of the following detailed description of the preferred embodiments.

BRIEF DESCRIPTION OF THE DRAWINGS

FIG. 3 shows a second embodiment of the invention which includes a circuit for selectively attenuating the signal from the FM demodulator during the turnaround interval;

FIG. 4 illustrates the relationship between the frequency demodulator output during normal operation and during turnaround;

FIG. 5 shows the tape speed characteristic for a reversible-tape recorder;

FIG. 8 shows in block diagram yet a further embodiment of the present invention in which a damped oscillation signal is inserted in the audio channel during the turnaround interval;

FIG. 9 shows in detailed schematic an oscillator for use in the circuit of FIG. 8; and FIG. 10 shows in block diagram a further embodiment of the invention which includes a circuit for inserting a noise signal of appropriate level into the audio channel during turnaround.

DETAILED DESCRIPTION OF THE PREFERRED EMBODIMENTS

Figure 1:
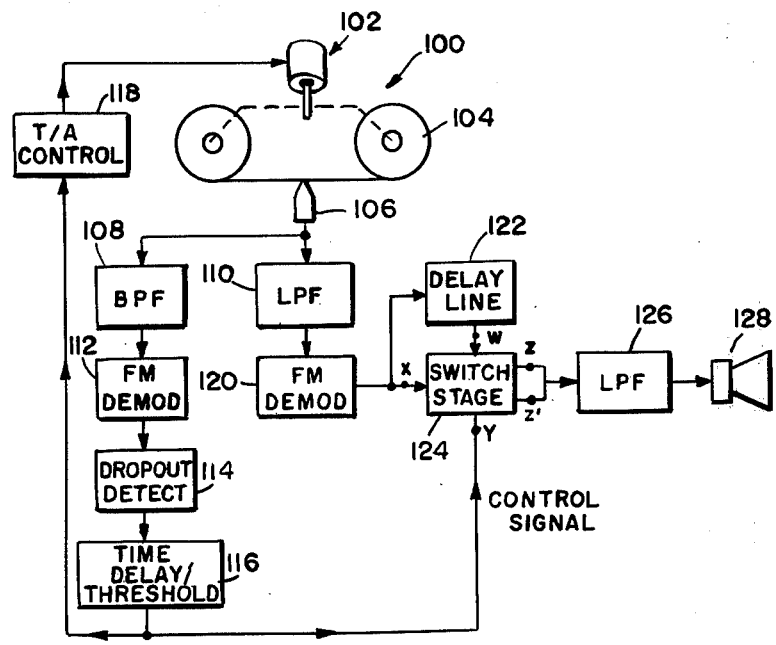
FIG. 1 shows in block diagram form a first embodiment of the invention using a switched delay line for inserting a delayed audio signal into the turnaround interval of a reversible drive tape recorder.

FIG. 1 shows in block diagram form a reversible-drive tape recorder unit 100 having a motor 102 and tape rolls 104 which carry both video and audio information in frequency-modulated form. Tape recorder 100 may be, for example, of the type described in U.S. Pat. No. 3,985,272, in which the audio information is sequentially recorded on multiple tracks of the tape. As described in the last mentioned patent, particularly with respect to FIGS. 5 and 6 of the patent, electronic circuitry is provided for periodically reversing the direction of tape travel when an end of the tape is reached, in response to detection of the end of a track of information. Transducer 106 picks up signals from the tape, and the video and audio components are separated by means of Band Pass Filter 108 and Low Pass Filter 110. The video signal is then demodulated by FM demodulator 112 and dropout detector 114 senses the end of the tape track, triggering a time delay/threshold device 116 for providing a control signal to turnaround control circuit 118 when reversal of the tape drive is to take place. The manner in which the drop-out detector, the time delay/threshold and the turnaround control circuit operate are not the subject of the present invention and such devices are given as merely illustrative of circuits which provide a control signal indicative of a signal drop-out which may be used in operation of the present invention. The above-noted U.S. Pat. No. 3,958,272 describes in somewhat greater detail what these circuits comprise.

The frequency modulated audio signal off tape is received by FM demodulator 120 from Low Pass Filter 120, and transmitted, demodulated, to delay line 122 and terminal X of switch stage 124. The delay line may be a bucket brigade device or charge-coupled device (CCD), for example. The control signal from circuit 116 is transmitted both to turnaround control circuit 118 which reverses the polarity of power to motor 102 and causes the direction of tape travel to be reversed, and to terminal Y of switch stage 124 which normally transmits the demodulated audio signal input X to switch stage output Z'. In response to the control signal switch stage 124 opens the circuit between terminals X amd Z' and closes the circuit between terminals W and Z.

The output of delay line 122 is connected to terminals W of the switch stage. When a drop-out is to take place, the control signal activates switch stage 124 to insert a delayed segment of the audio signal in the audio channel. The outputs Z and Z' of switch stage 124 are supplied to a low pass filter 126 and drive a loudspeaker 128. Filter 126 removes audio frequency interference due to the FM demodulator, switching transients and the like.

It will be understood by those skilled in the art that while the circuit of FIG. 1 illustrates the principal of one embodiment of the present invention, numerous modifications in this embodiment may be made without departing from the spirit and scope thereof. For example, a unidirectional-drive helical scan recorder such as disclosed in the above-mentioned U.S. Pat. No. 3,407,266 to Araki et al could be substituted for the reversible drive system shown here in FIG. 1. This last-mentioned patent teaches a helical scan video recorder in which track-switching signal dropouts recur at periodic intervals. A disc is provided which rotates with the helically scanning head, the disc having an opening for allowing transmission of light to signal each drop-out interval. The control signal for activating switch stage 124 of the present invention could be derived from this photocell.

Alternatively, the drive system could include a moveable reproduction head mounted on a positioning device such as shown in U.S. Pat. Nos. 3,641,279 and 3,705,270 to Ganske and Huber, respectively. In this case the signal used to activate the head positioning device could also be used as a control signal for the switch stage 124 of the present invention.

It is well known in the art that when the input signal to the amplifier/limiter portion of an FM demodulator drops below a predetermined level, the demodulator will have at its output objectionable bursts of noise, as shown for example in FIG. 4. In this regard attention is directed to U.S. Pat. No. 3,356,794 to Felix which is similarly concerned with the noise bursts appearing at the output of an FM demodulator. The present invention accordingly provides, in the FIG. 1 embodiment, means for replacing the noise bursts occurring during the turnaround interval with a portion of the preceding audio signal so as to avoid having the objectionable noise bursts transmitted to the audio output loudspeaker 128.

FIG. 5 illustrates the relation between tape speed reversal for a drive system such as that described in U.S. Pat. No. 3,958,272 and the noise bursts of FIG. 4. The present inventors have found that the tape speed reversal time from full forward speed to full reverse speed can be reduced to around 80–100 msec., but that the audio signal output from the FM demodulator is acceptable during all but 30–40 msec. of that interval. The control signal from circuit 114 could, if desired, be modified before application to terminal Y of switch stage 120 so as to cause the insertion of the delayed audio signal to take place only over the critical 30–40 msec. interval, rather than the entire 80–100 msec. interval. Since pulse shaping circuits and the like which would be suitable for such purpose are well known in the art, no further discussion thereof is deemed necessary here.

Figure 2:
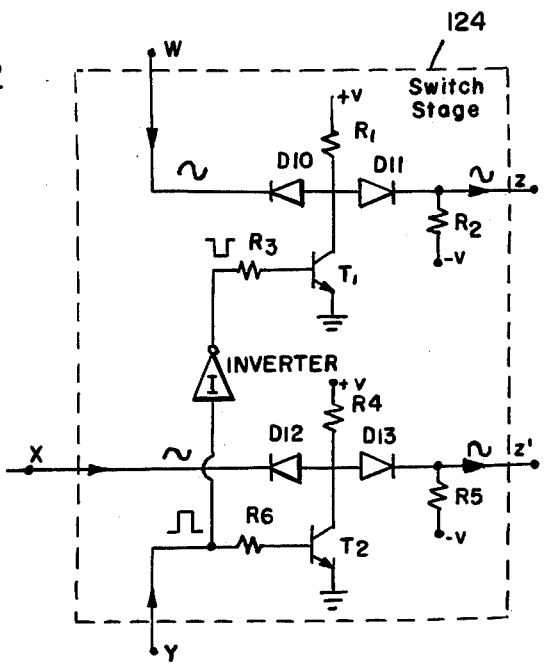
FIG. 2 shows a circuit diagram of the switch stage of FIG. 1.

FIG. 2 shows a circuit diagram of a switch stage 124 which is suitable for use in the circuit of FIG. 1. When the control signal supplied to terminal Y is at a low level, transistor T2 is non-conductive and diodes D11 and D13 are forward biased, so that the signal appearing at terminal L will be transmitted to terminal Z'. Inverter I assures that transistor T1 is conductive when transistor T2 is non-conductive, and vice versa. Therefore, when diodes D12 and D13 are forward biased, diodes D10 and D11 are reverse biased and no signal passes from terminal W to terminal Z. The reversal of polarity of the control signal during the turnaround interval causes the circuit from terminal W to terminal Z to be closed and the circuit from terminal X to terminal Z' to be opened. The circuit of FIG. 2 is merely exemplary and those skilled in the art will recognize that further switch circuits or devices could be substituted therefor without departing from the spirit and scope of the present invention.

FIG. 3 shows a second embodiment of the present invention which includes a circuit for avoiding the objectionable noise bursts which would otherwise result from the frequency demodulator in the audio channel of a reversible drive video recorder such as that taught in U.S. Pat. No. 3,958,272. As in FIG. 1 above, the tape drive 100 comprises essentially a reversible motor 102 and tape rolls 104. Transducer 106 is mounted for reproducing signals from the tape and provides such signals to both a low pass filter 110 in the audio channel, and a band pass filter 108 in the video and control signal channel. The components used to obtain the control signal, in particular band pass filter 108, FM demodulator 112, drop out detector 114, time delay/threshold 116 and turnaround control circuitry 118, may be of the type described with reference to FIG. 5 of the last mentioned U.S. Pat. No. 3,958,272. The control signal obtained from circuit 116 is used for activating reversal of the tape drive by turnaround control circuit 118, and is also used to trigger attenuating circuit 130.

The operation of circuit 130 is as follows. The audio signal output from FM demodulator 120 is fed to circuit 130 and the signal passes through resistor R11 and amplifier AMP 1 to low pass filter 126, which comprises a resistor R16 and a capacitor C3, for example. The output of low pass filter 126 is connected to loud speaker 128. Field effect transistor FET 1 and resistor R11 form a voltage divider circuit which serves to attenuate the sound signal going to amplifier AMP 1 in dependence upon the gate voltage on FET 1. Field effect transistor FET 2 normally inhibits the activation of FET 1. When the control signal is applied to the base of FET 2 through resistor R15, FET 2 becomes a low impedance and the voltage on capacitor C1 is fed to the gate of FET 1. If the voltage on capacitor C1, is large, FET 1 represents a large resistance value connecting the input of amplifier AMP 1 to ground. When the voltage on capacitor C1 is small, the impedance of FET 1 is also small and will result in attenuation of the noise burst from frequency demodulator 120 during the drop-out interval.

The voltage stored in capacitor C1 and applied to the base of FET 1 during turnaround in proportional to the average audio signal amplitude before turnaround. This is a result of diodes D14 and D15, which permit capacitor C1 to integrate the negative half cycles of the audio signal. The time constant of resistance R12 and capacitor C1 must of course be large in comparison with the known drop-out interval. Those skilled in the art will recognize that the components of attenuating circuit 130 may be chosen so as to attenuate the signal from FM demodulator 120 during the turnaround drop-out to any desired level. It is to be noted, however, that the inventors have found attenuation of the noise bursts to a level which is approximately 3-6 dB below the average level of the immediately preceding audio signal renders the drop-outs of signal to the FM demodulator least noticeable to the listener.

FIG. 4 shows the output of the FM demodulator in the audio channel of a reversible-type recorder as described in U.S. Pat. No. 3,958,272. Normal audio signal levels 132 obtain during full-speed tape operation, but large amplitude bursts of audio-frequency noise 134 occur during a significant portion of each turnaround interval. Tests conducted by the inventors have indicated that a periodic noise burst 134 is noticeable to the untrained listener and that substitution of complete sound drop-out for the noise burst is likewise noticeable. The attenuating circuit of FIG. 3 serves to attenuate the noise bursts to an intermediate level 136 which is unnoticeable to the listener. This intermediate level is preferably at about 3-6 dB down from the preceding audio signal level.

Figure 6:
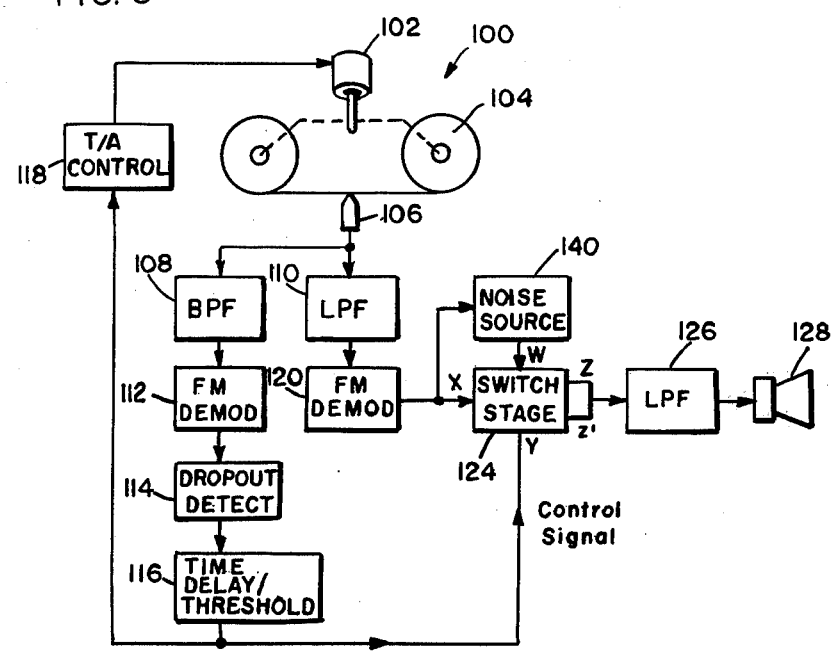
FIG. 6 shows in block diagram a third embodiment of the invention which includes a circuit for inserting a "colored" noise signal during the turnaround interval.

FIG. 6 illustrates yet another circuit for maintaining a suitable audio signal level during intervals of signal drop-out to the FM demodulator during turnaround. A control signal is obtained for indicating the drop-out interval in the same fashion as described above with respect to FIG. 1 and is used to operate a switch stage 124 such as shown in FIG. 2. The FIG. 6 arrangement is very similar to the arrangement of FIG. 1, with noise source 140 substituted for delay line 118. This noise source produces an audio-frequency "colored" noise signal which is inserted by means of switch stage 124 into the audio channel during the drop-out interval.

Figure 7:
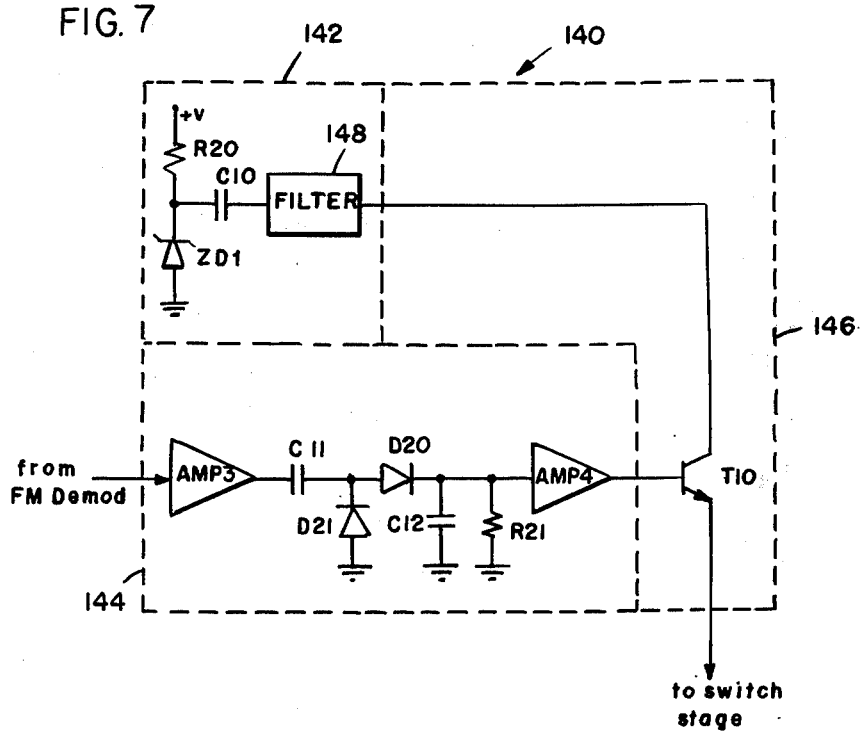
FIG. 7 shows in detailed schematic the "colored" noise source for the circuit of FIG. 6.

FIG. 7 shows in greater detail the noise source 140 for use in the circuit of FIG. 6. The noise source comprises a "colored" noise generator 142, an integrating circuit 144 and a proportional gate 146. The "colored" noise generator is essentially a resistor R20 connected in series with a zener diode ZD1 between a positive dc voltage source and ground, with a capacitor C10 connected to the junction of resistor R20 and rectifier SCR, and a filter 148 for passing only selected audio frequency components of the noise generated.

Integrating circuit 144 receives the demodulated audio signal from FM Demodulator 120 and passes the signal through a buffer amplifier AMP 3 and capacitor C11. Diode D20 passes the positive components of audio signal to capacitor C12, while diode D21 passes the negative components of the audio signal to ground. Capacitor C12 thereby integrates the positive half-cycles of the audio signal and stores a voltage proportional to the average audio signal level. Amplifier AMP 4 detects the voltage on capacitor C12 and opens transistor T10 of gate 146 in proportion to the average audio signal voltage. The values of capacitor C12 and resistor R21 are selected so that the RC time constant will be somewhat greater than the known length of the drop-out interval, and a further controlled switch responsive to the control signal may be installed between FM demodulator 120 and AMP 3 so that the voltage stored on C12 will be unaffected by noise bursts from the FM demodulator during the drop-out interval. Those skilled in the art will recognize how this may be accomplished using, for example, a switch stage as shown in FIG. 2.

The output signal of noise source 140 which is connected to terminal W of switch stage 124 in FIG. 6 therefore comprises audio-frequency noise which is of a level related to the preceding segment of demodulated audio from tape. When the control signal operates switch stage 124 to connect terminal W to output Z during turnaround, the signal from the noise source passes through filter 126 to loudspeaker 128. The noise signal level at the loudspeaker is, of course, related to the immediately preceding program level. As noted above, the inventors have found that the drop out interval is least disturbing to the listener when the noise signal inserted during the turnaround interval is approximately 3-6 dB below the preceding average audio signal level. The signal could, however, be inserted at an amplitude roughly equal to the preceding average audio signal level without being substantially noticeable.

FIGS. 8 and 9 show yet another embodiment of the present invention in which an oscillator stage is switched into the audio channel by switch stage 124 in response to the control signal. The oscillator stage is shown in detail in FIG. 9. The demodulated audio signal from FM demodulator 120 is received at terminal X of switch stage 152, which may be of the type shown in FIG. 2. During normal tape operation the signal from terminal X is passed to terminal Z' and buffer amplifier AMP 5 passes the signal through capacitor C13 to diodes D22 and D23. Diode D23 shunts the positive portions of the audio signal to ground while diode D22 passes the negative portions of the audio to capacitor C14. Capacitor C14 integrates the negative half-cycles of the audio signal and stores a charge which is proportional to the prevailing average audio signal level. It is to be noted that the RC time constant of capacitor C14 and resistor R22 is necessarily greater than the length of the audio signal drop-out interval.

At turnaround the control signal is supplied to control terminal Y of switch stage 152 and the charge on capacitor C14 is applied to an oscillator stage through capacitor C15 connected to terminal Z of the switch stage. The oscillator circuit consists chiefly of a resonant circuit comprising inductance L1 and capacitors C16 and C17, as well as transistor T11. The feedback of the circuit and the damping coefficient of the oscillation obtained at the output are adjustable by means of trimming resistor R26 inserted between capacitors C16 and C17 and the emitter of transistor T11. The oscillator circuit is set to a state of unstable equilibrium; that is, at the point where it is just ready to begin oscillation. This state is achieved by selecting a feedback factor less than 1.

When a signal pulse from capacitor C14 is applied via coupling capacitor C15 to the oscillator circuit in response to the control signal, a damped oscillation is set up at the emitter of transistor T11, which is the output of the oscillator stage 150. The amplitude of the signal output from the oscillator stage depends upon the voltage on the storage capacitor C14 and the duration of oscillation depends upon the time constant of the oscillator circuit. Those skilled in the art will recognize that the oscillator circuit time constant is preferably made larger than the turnaround drop-out interval. Resistors 23-25 and capacitor C18 are used, as is conventional, for voltage supply and blocking purposes.

FIG. 10 shows yet another embodiment of the present invention herein an AM demodulator 160, low pass filter 162, AM modulator 164 and noise source 166 are connected for providing an audio-frequency signal to be inserted during the drop-out interval. A noise spectrum of suitable audio-frequency signals from 166 is amplitude-modulated with the low-frequency signal components of the envelope of the audio signal produced by AM demodulator 160 from the output of FM demodulator 120. The low pass filter 162 is preferably dimensioned so that its time constant is larger than, or equal to, the duration of the turnaround drop-out.

In the circuit arrangements described above it is desirable that the frequency range and frequency composition of the signal used for bridging the signal drop-out are preferably chosen so that interuptions in the audio information are perceived by the listener not as a loud audio noise burst or drop-out, but at worst as a slight change in timbre and/or amplitude. Tests by the inventors have shown that audio nose spectra in the region of 1 kHz fulfill these requirements if the audio signal transmitted during the turnaround interval is of an amplitude corresponding to approximately ½ the amplitude of the immediately preceding signal. In apparatus where switching from one or more tracks to adjacent tracks occurs periodically, for example in video tape recorders of the helical scan or reversible drive type, or in automatic video disc players, the length of the bridging signal will depend on the duration of the given switching interval. In known reversible-drive tape recorders wherein tape speed reversal and track switching occur simultaneously, such as described in U.S. Pat. No. 3,958,272, the drop-out interval is about 30–40 msecs.

Although the foregoing embodiments have been described with reference to audio reproduction channels in which the audio signal is retrieved from tape in frequency-modulated form, those skilled in the art will recognize that amplitude modulated audio signals or unmodulated baseband audio signals having drop-outs occurring during switching or tape reversal intervals or the like may be easily adapted for use with the audio noise insert circuits shown, for example, in the foregoing FIGS. 1, 6, 8 and 10.

We claim:

1. In a sound system of the type in which audio information carried sequentially on multiple tracks of a magnetic recording tape is played back, via a playback path terminating in sound reproduction means, with the aid of a reversible tape drive including means for scanning said tape, an arrangement for minimizing the audible effect of dropouts in the reproduced audio information which occur incident to each tape reversal, said arrangement comprising:
    means for continuously storing a signal varying in dependence on the recorded audio information as it is scanned by said scanning means;
    means for generating a control signal indicating the occurrence of each said dropout; and switching means controlled by said control signal and in circuit connection with said playback path, said switching means normally supplying to said reproduction means a first audio signal derived from said scanning means, and said switching means operating in response to said control signal to supply to said sound reproduction means, for the duration of each said dropout, a second audio signal correlated to said varying signal as stored by said storing means a predetermined time prior to each said dropout.

2. The arrangement of claim 1, wherein said audio information is carried on said recording medium in frequency-modulated form, said arrangement further comprising, interposed between said scanning means and said reproduction means, means for demodulating the audio information from said scanning means.

3. The arrangement of claim 2 wherein the output of said frequency demodulator during each said dropout comprises an audio-frequency noise burst of substantially larger amplitude than said reproduced audio information, said switching means further including means for attentuating said noise burst to a level correlated to said stored signal and thereby producing said second audio signal, whereby the audible effect of said dropouts is reduced by attenuating the noise bursts which occur during the reproduction of said audio information.

4. The arrangement of claim 1 wherein said storing means comprises means for integrating said first audio signal for said predetermined time prior to each said dropout, said signal stored in the storing means being the integrated audio signal.

5. The arrangement of claim 1 wherein the amplitude of said second audio signal is between about 0 dB and 6 dB below the average amplitude over said predetermined time of said first audio signal.

6. The arrangement of claim 1 wherein said storing means comprises means for detecting the envelope of said first audio signal and means for passing with a time delay predetermined low frequency components of said envelope, said low frequency passing means having a time constant at least equal to the length of said dropout, the arrangement further including means for producing a noise signal and means for amplitude modulating said noise signal with said low frequency envelope components, thereby producing said second audio frequency signal.

7. The arrangement of claim 1 wherein said switching means comprises at least one semiconductor switch.

8. The arrangement of claim 1 further comprising means for generating an audio frequency signal having an amplitude determined by said stored signal, said second audio signal being said generated audio-frequency signal.

9. The arrangement of claim 8 wherein said generating means comprises a noise source and a controllable gate for passing the output signal from said noise source to said switching means at an amplitude proportional to the value of said stored signal.

10. The arrangement of claim 9 wherein said noise source comprises a resistor and a reverse-biased zener diode in series-connection, a capacitor connected to the junction of said series-connected resistor and diode, and a filter connected to said capacitor whereby selected audio frequency components of noise produced by said reverse-biased diode are passed through said capacitor and said filter.

11. The arrangement of claim 8 wherein said generating means comprises an oscillator connected for receiving an impulse from said storing means when a said dropout occurs and producing for the duration of the dropout an audio frequency oscillation related in amplitude to said stored signal, said produced audio frequency oscillation being said second audio signal.

12. In a sound system of the type in which audio information carried sequentially on multiple tracks of a magnetic recording tape is played back, via a playback path terminating in sound reproduction means, with the aid of a reversible tape drive including means for scanning said tape, an arrangement for minimizing the audible effect of dropouts in the reproduced audio information which occur incident to each tape reversal, said arrangement comprising:

a delay line for continuously storing a signal varying in dependence on the recorded audio information as it is scanned by said scanning means;

means for generating a control signal indicating the occurrence of each said dropout; and switching means controlled by said control signal and in circuit connection with said playback path, said switching means normally supplying to said reproduction means a substantially undelayed segment of the audio signal derived from said scanning means, and said switching means operating in response to said control signal to supply to said sound reproduction means, for the duration of each said dropout, the segment of said audio information stored in said delay line a predetermined time prior to each said dropout.

* * * * *